United States Patent [19]
Lootens

[11] 3,763,403
[45] Oct. 2, 1973

[54] ISOLATED HEAT-SINK SEMICONDUCTOR DEVICE

[75] Inventor: William F. Lootens, Skaneateles, N.Y.

[73] Assignee: General Electric Company, Syracuse, N.Y.

[22] Filed: Mar. 1, 1972

[21] Appl. No.: 230,760

[52] U.S. Cl. ..... 317/234 R, 317/234 A, 317/234 E, 317/234 F, 317/234 H, 317/234 G, 174/52 S
[51] Int. Cl. .......................... H01l 3/00, H01l 5/00
[58] Field of Search .................... 317/234, 1, 3, 3.1, 317/4, 4.1; 173/DIG. 5, DIG. 3, 52 S

[56] References Cited

UNITED STATES PATENTS

| | | | |
|---|---|---|---|
| 3,311,798 | 3/1967 | Gray | 317/234 A |
| 3,549,958 | 12/1970 | Margolien | 317/234 A |
| 3,548,267 | 12/1970 | Siddell et al. | 317/234 E |
| 3,597,666 | 8/1971 | Taskovich | 317/234 E |
| 3,469,017 | 9/1969 | Starger | 317/234 |
| 3,469,148 | 9/1969 | Lund | 317/234 |
| 3,569,797 | 3/1971 | Simmons | 317/234 |
| 3,581,387 | 6/1971 | Buck et al. | 317/234 |
| 3,609,471 | 9/1971 | Scace | 317/234 |

FOREIGN PATENTS OR APPLICATIONS

| | | | |
|---|---|---|---|
| 1,553,893 | 12/1968 | France | 317/234 G |

*Primary Examiner*—John W. Huckert
*Assistant Examiner*—Andrew J. James
*Attorney*—Robert J. Mooney et al.

[57] ABSTRACT

Plastic encapsulated power semiconductor devices, such as controlled rectifiers, triacs and power transistors, are disclosed in which the semiconductor body of the device is electrically isolated from the combination heat sink and mounting plate of the device by a thin ceramic electrically insulative plate of high thermal conductivity which provides bonding sites for anchoring the inner ends of the external leads associated with the semiconductor body. One of the external leads bonded to the insulative plate has a portion underlying the semiconductor body and providing an electrically conductive path of high thermal conductivity for heat extraction from the semiconductor body.

3 Claims, 6 Drawing Figures

Patented Oct. 2, 1973 3,763,403

2 Sheets-Sheet 1

ISOLATED HEAT-SINK SEMICONDUCTOR DEVICE

The present invention relates to improvements in plastic encapsulated power semiconductor devices such as low cost controlled rectifiers, triacs, and power transistors for the consumer and industrial markets. More particularly, the invention relates to a semiconductor device of the foregoing type having improved built-in electrical isolation between the integral mounting plate forming the heat-sink of the device and the semiconductor body electrode leads of the device.

Plastic encapsulated power semiconductor thyristors and transistors for the consumer and industrial markets have been known heretofore in which the semiconductor body portion of the device is soldered directly to a relatively thick underlying mounting plate of electrically conductive material having excellent thermal conductivity, such as copper, the mounting plate serving as a heat-sink for the remainder of the device. The mounting plate of such devices in turn is directly connected, within the encapsulated portion, to one of the external leads of the device.

For some applications the electrical connection of the mounting plate to the external lead has certain drawbacks, because the heat-sink may thereby at times experience a voltage other than neutral or ground potential. Since the mounting plate usually serves as the external mechanical mounting means for the device, and is usually mechanically attached, by a bolt or screw or the like, to other electrically conductive elements of the circuitry or equipment with which the device is associated, the presence of a non-neutral potential on the mounting plate necessitates special provisions to insulate the mounting plate electrically from the remainder of the equipment. To avoid this problem it has been recognized by those skilled in the art that electrical isolation of the semiconductor body portion of such a device and all external leads associated therewith, from the underlying mounting plate, would be quite desirable.

Prior art attempts to achieve such electrical isolation, within the economic constraints and other constraints imposed by the need for special suitability of the product for high volume, low cost, high yield production, have not been altogether satisfactory. For example some prior art attempts to solve this isolation problem, though achieving satisfactory electrical isolation, have involved exposing the semiconductor body portion of the device to excessive mechanical stresses during plastic encapsulation, incurring excessive assembly costs, and limiting capability of the finished device to withstand current or voltage surges.

Accordingly, it is one object of the present invention to provide an improved plastic encapsulated power thyristor or transistor, of the electrically isolated mounting plate type, having an improved ability to withstand applied current or voltage surges and other thermal transient-producing effects.

Another object is to provide a plastic encapsulated power semiconductor device of the foregoing character which is particularly suited for low cost manufacture with high yields to desired levels of electrical performance.

Another object is to provide an improved semiconductor device of the foregoing type in which the risk of undesirable mechanical stresses being imposed on the semiconductor body thereof during and after encapsulation is completely eliminated.

Another object is to provide a semiconductor device of the foregoing character having improved mechanical ruggedness including strengthened interengagement of the plastic encapsulant, external leads, and other parts of the device.

These and other objects of the present invention will be apparent from the following description and the accompanying drawings wherein.

Figure 1:
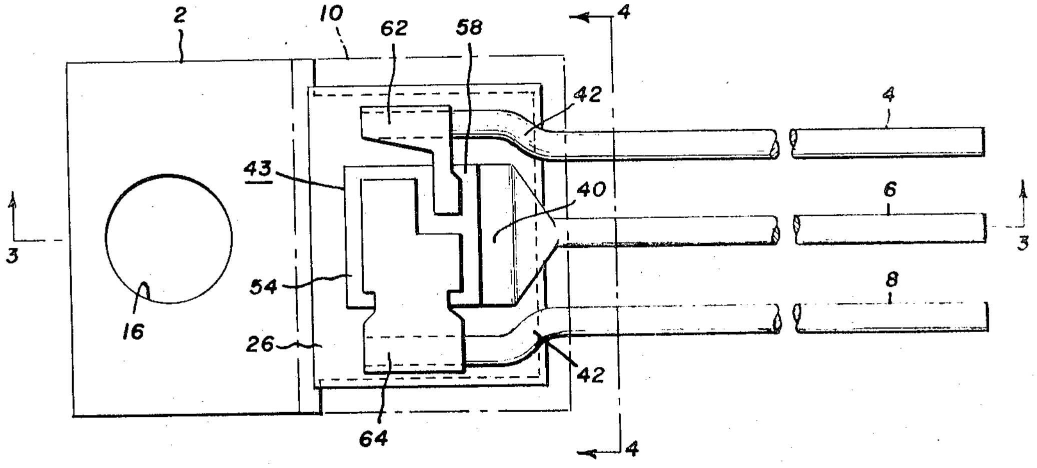
FIG. 1 is a partially broken away plan view of a plastic encapsulated power semiconductor device constructed according to the present invention.

Turning now to a detailed description of one form of semiconductor device constructed in accordance with the present invention, and with particular reference to the drawings, a semiconductor device as shown in FIG. 1 includes a combination mounting plate and heat-sink 2, external electrode leads 4, 6, and 8, and a plastic encapsulation 10. Mounting plate 2 consists of a relatively thick slab of highly thermally-conductive material, such as copper, nickel plated and having a sufficient area and mass to receive the heat generated within the encapsulated portion of the device during operation. The mounting plate 2 may preferably consist of a segment of a strip 12 made up of a series of similar plates integrally connected by severable link portions 14. An aperture 16 in plate 2 facilitates direct connection thereof by a bolt or other suitable fastener (not shown) to other equipment with which the device is associated when in use, and to which heat can flow from mounting plate 2. The plate 2 further includes an integral extended flat platform portion 18, of slightly diminished width and provided on its side edges with an outstanding rib or bead 20. This rib 20 forms a downwardly facing shoulder 22 which interlocks with the plastic encapsulant 10 to help insure against separation thereof from the plate.

Mounted on the upper major face of the platform 18 is a thin wafer 26, having a thickness of for example 15 mils, of electrically insulative material of high dielectric constant and good thermal conductivity, such as alumina or beryllium oxide or aluminum nitrude. On its top major face the insulative wafer 26 is provided with a centrally located metallized region 28 forming a bonding site, as will hereinafter be more fully described. The metallized region may consist for example of a foundation layer of a fired molybdenum-manganese mixture known to those skilled in the art, a layer of nickel plating over the foundation layer, and a top coating of a suitable solder. One suitable solder for coating the metallized regions 28, 30, 32 as well as joining other parts to plate 26 is a mixture of 92.5 percent lead, 5 percent tin and 2.5 percent silver, by weight. Two similar side metallized regions 30, 32 are provided on wafer 26, symmetrically laterally spaced from central region 28. As shown, the central region 28 is substantially square and the side regions 30, 32 are rectangular, with their long dimension parallel to the sides of platform 18. The insulative wafer 26 is also metallized on its bottom major face (not shown) to facilitate bonding it by a layer of solder onto platform 18. To facilitate assembly of wafer 26 with either side up, its bottom face metallization is preferably made identical in pattern with that of its top.

Soldered to the respective metallized regions 28, 30, 32 on the top face of wafer 26 are the inner end portions of the three external leads 4, 6 and 8, the outer portions of which extend in essentially coplanar spaced parallel relation beyond the end of the platform 18. Leads 4, 6 and 8 may be, for example, copper, plated with nickel and having an outer layer of gold for enhanced solderability. The inner end portion of the center lead 6 has a flattened, paddle-like segment 40 substantially coextensive in area with the central metallized region 28 to which it is soldered. The inner end portion of each side lead 4, 8 has a pair of bends forming a crank-like segment 42 which provides a shoulder effectively locking its lead against axial displacement relative to the plastic encapsulant 10. The segments 42 further enable displacement of the inner ends of leads 4, 8 normal to the plate 26, by rotating the lead about the axis of its outer end portion, to allow for minor variations in lead spacing or position without disturbing the essentially coplanar relationship of the external portions of the leads.

Figure 2:
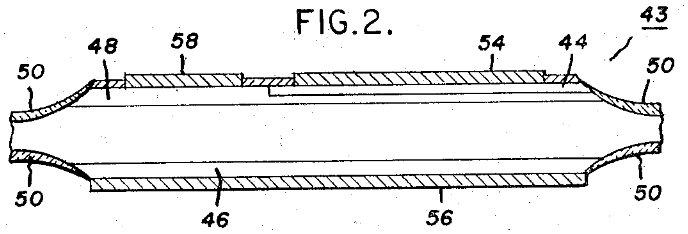
FIG. 2 is a sectional view, to an enlarged scale, of one form of three-electrode semiconductor body suitable for incorporation in a plastic encapsulated power semiconductor device constructed in accordance with the present invention.
Figure 3:
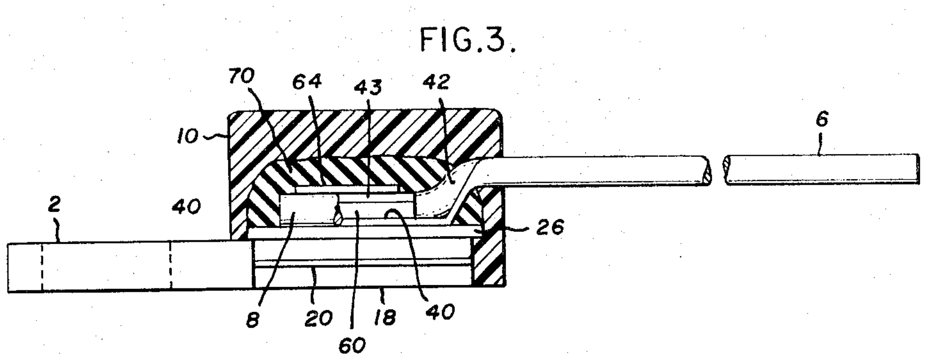
FIG. 3 is a sectional view of the structure of FIG. 1, taken on the line 3—3 thereof.
Figure 4:
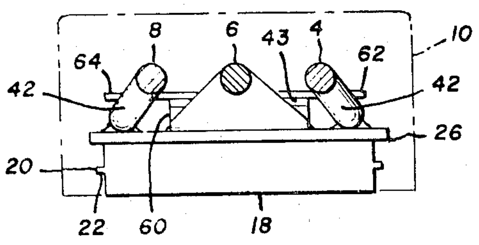
FIG. 4 is a sectional view of the structure of FIG. 1, taken on line 4—4 thereof.
Figure 5:
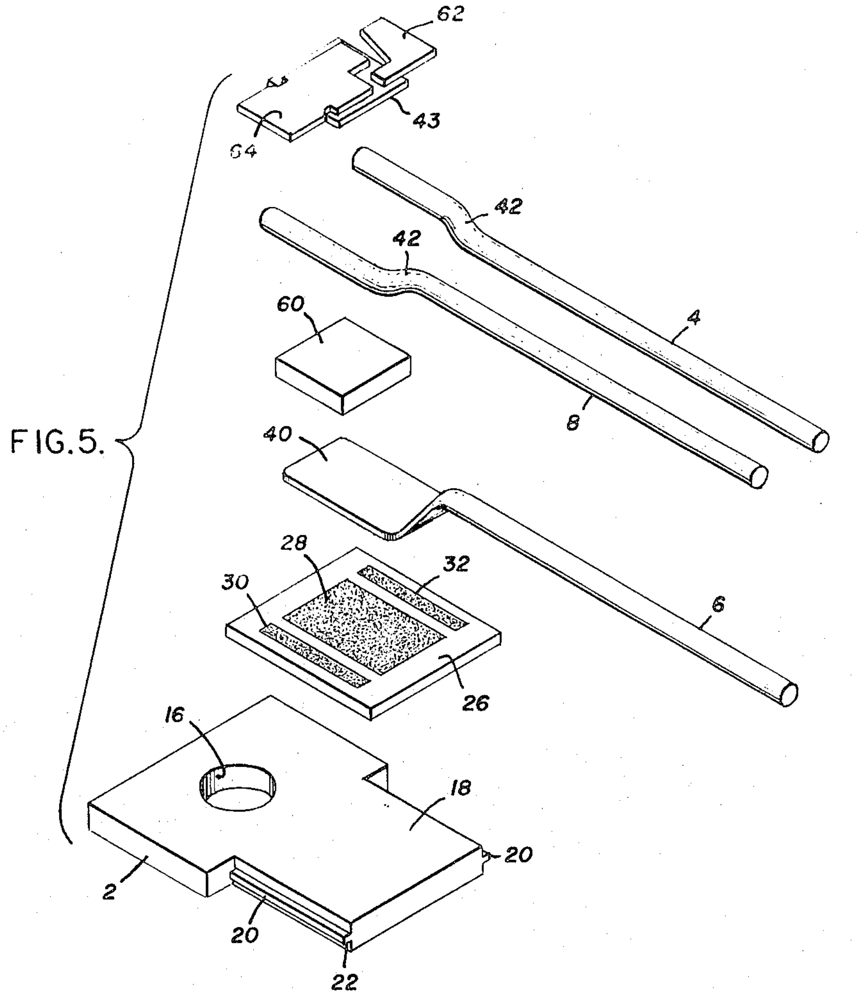
FIG. 5 is an exploded perspective view showing the relationship of the principal parts of the semiconductor device of FIGS. 1, 3, and 4.
Figure 6:
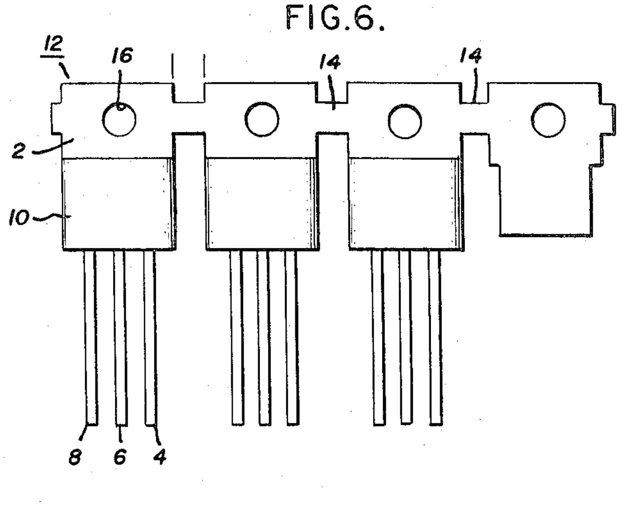
FIG. 6 is a partly broken away view, to a diminished scale, of a plurality of semiconductor devices constructed according to the present invention, and integrally joined by a common strip constituting their heat-sink portions.

Overlying the top surface of the paddle segment 40 of center lead 6, and approximately matching it in area, is the semiconductor body portion of the device, one exemplary embodiment of which is shown in greater detail in FIG. 2. Referring to FIG. 2, the semiconductor body is of generally plate-like form, having a thickness of about 8 mils and approximately square major faces about 120 mils on an edge. The semiconductor body includes, as is well known to those skilled in the art, main electroded regions 44, 46 adjacent its top and bottom major faces and defined by P/N junctions, and a gate or control signal input region 48 also adjacent the top major face. One or more of the P/N junctions may extend to the side wall of the semiconductor body, and there be covered by a suitable protective passivant 50, which is preferably glass. The three regions 44, 46, 48 are provided with respective electrodes or contacts 54, 56, 58 for electrical connection to external leads 4, 6, 8.

The semiconductor body is connected to paddle segment 40 by an intermediate underlying high thermal conductivity metal slug 60 soldered to the lower face of the semiconductor body and the upper face of paddle segment 40. The slug 60 may be copper, for example, about 0.020 inch thick, nickel-plated and solder-coated both top and bottom. The slug 60 has a much larger mass than the semiconductor body, and serves to extract heat quickly from the semiconductor body when the body is subjected to any sudden thermal excursions such as those which characterize applied current surges or spikes. The heat thus absorbed quickly by slug 60 is in turn more gradually drained away through isolation wafer 26 to the heat-sink 2 which of course has a very much larger mass. Thus the slug 60 greatly enhances the ability of the device to withstand severe current surges, for example as large as 150 amperes for a semiconductor body only 8 mils thick and having major faces about 120 by 120 mils, without deleterious effect. Moreover, even with such surge capability, isolation capable of withstanding several thousand volts differential between heat-sink 2 and the leads 4, 6 and 8 is assured by wafer 26 as described.

Side lead 4 is electrically connected to the gate region contact or electrode 58 of the emiconductor body by an inner gate lead 62 soldered over the inner end portion of the lead 4 and the electrode 58, respectively. Likewise, the other side lead 8 is connected to the upper emitter electrode 54 of the semiconductor body by an inner lead 64 soldered to electrode 54 and side lead 8. Both inner leads 62 and 64 may consist of thin copper sheets, nickel-plated and solder-coated on at least their under sides, and lanced from a lead frame (not shown) providing a plurality of sets of such leads.

To facilitate assembly of the device, heat extractor slug 60 and the semiconductor body and two inner leads 62, 64 may conveniently be pre-connected as a subassembly, for example by stacking these parts and passing them through a tunnel oven. This subassembly may then be suitably fixtured in stacked relation with the mounting plate 2, isolating wafer 26, and external leads 4, 6, 8, taking care that the cantilevered outer end portions of leads 4, 6, 8 are temporarily appropriately supported so that their inner ends are in good contact with metallized areas 28, 30, 32. Another suitable tunnel oven pass of this total assemblage will then join plate 26 to plate 2, leads 4, 6 and 8 to plate 26, leads 62 and 64 to leads 4 and 8, and slug 60 to center lead 6. The solder pre-coating of the bottom of slug 60 and the solder coating on region 28 eliminates the need, and cost, of solder pre-coating paddle segment 40.

After the above-described assembly operations, the side walls of the semiconductor body, as well as passivant 50 and other areas in the vicinity thereof, may be covered with a conformal coating of a suitable inert flexible material, such as an RTV silicone compound, which provides additional protection during application of encapsulant 10. The assemblage is then ready for plastic encapsulation. The encapsulation process may conveniently be performed in a multicavity mold to provide a plurality of completed devices joined only by link portions 14. While various suitable encapsulants may be used within the contemplation of the present invention, one preferred encapsulant 10 is a glass fiber-filled silicone resinous compound. Since the external leads of each device are electrically isolated from mounting plate 2, the devices may be conveniently handled, shipped, electrically tested, or indeed installed for use if desired, without severing or prior to severing the link portions 14.

The novel structural features of the isolated heat-sink power semiconductor device above described provide a number of practical advantages in terms of low cost of parts, ease of assembly, product mechanical ruggedness, and desirable electrical characteristics. For example, double-sided metallization of wafer 26 simplifies parts stacking, only two oven passes are required to complete the assembly, and the heat extractor 60 affords excellent surge capability. The shoulders formed by the crank-like segments 42 of the side leads 4, 8 as well as shoulder 22 of rib 20 and the other projecting surfaces of the soldered assembly, insure an excellent mechanical interlock with the plastic encapsulant 10. Moreover, all external leads are anchored directly to the wafer 26, rather than any portion of the semiconductor body, which essentially precludes transmission of deleterious mechanical stresses from the external leads to the semiconductor body.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What I claim as new and desire to secure by Letters Patent of the United States is:

1. In a semiconductor device including a relatively thick mounting plate of high thermal conductivity metal and a semiconductor body having a bottom major face provided with an electrode and a top major face provided with other electrodes, a thin wafer of electrically insulative thermally conductive material overlying a portion of said mounting plate and having its bottom major face thermally-conductively bonded to said mounting plate, the top major face of said wafer having a plurality of spaced metallized external lead bonding sites, a central external wire-like lead and two side external wire-like leads bonded at their respective inner end portions to said respective bonding sites, the inner end portion of the central lead including a thin flattened paddle-like segment having a top surface and having a bottom surface thermally conductively bonded across its entirety to its respective bonding site on said wafer, heat reservoir means consisting of a high thermal conductivity metal slug of much larger mass than the semiconductor body, said slug being thermally and electrically conductively joined to and extending between the entirety of the bottom major face of said semiconductor body and the entirety of the top surface of said flattened segment, respective inner leads joining the inner end portions of said side external leads to the other respective electrodes of said semiconductor body, said wafer, slug, semiconductor body, inner leads, and inner end portions of said external leads all being enclosed in a plastic encapsulant from which said mounting plate and the remainder of said external leads extend.

2. A semiconductor device as defined in claim 1 wherein said side leads extend from said encapsulant in parallel coplanar relation with said central lead and have crank portions for adjusting the spacing of their inner ends relative to their outer end portions by rotation of each side lead about the axis of its outer end portion.

3. A semiconductor device as defined in claim 1 wherein said mounting plate has peripherally extending ribs on its side walls forming shoulders interlocking with the encapsulant.

* * * * *